(12) United States Patent
Hiyama

(10) Patent No.: US 9,013,850 B2
(45) Date of Patent: Apr. 21, 2015

(54) SEMICONDUCTOR DEVICE

(75) Inventor: Kazuaki Hiyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 317 days.

(21) Appl. No.: 13/479,853

(22) Filed: May 24, 2012

(65) Prior Publication Data

US 2013/0083442 A1 Apr. 4, 2013

(30) Foreign Application Priority Data

Sep. 30, 2011 (JP) .................. 2011-216533

(51) Int. Cl.
H02H 3/08 (2006.01)
H03K 17/082 (2006.01)

(52) U.S. Cl.
CPC ................... H03K 17/0828 (2013.01)

(58) Field of Classification Search
USPC ........................................ 361/93.7
See application file for complete search history.

(56) References Cited

U.S. PATENT DOCUMENTS

| | | | | |
|---|---|---|---|---|
| 5,375,029 A | * | 12/1994 | Fukunaga et al. | 361/101 |
| 5,945,802 A | * | 8/1999 | Konrad et al. | 318/807 |
| 2002/0141126 A1 | * | 10/2002 | Tabata | 361/93.7 |
| 2002/0176215 A1 | * | 11/2002 | Hiyama et al. | 361/93.1 |
| 2008/0198526 A1 | * | 8/2008 | Hiyama | 361/93.7 |

FOREIGN PATENT DOCUMENTS

| | | |
|---|---|---|
| DE | 43 34 386 A1 | 4/1994 |
| JP | 6-120787 | 4/1994 |
| JP | 2999887 | 11/1999 |
| JP | 2008-206348 | 9/2008 |
| KR | 10-1999-0003737 | 1/1999 |

OTHER PUBLICATIONS

Korean Office Action issued Sep. 30, 2013, in Korea Patent Application No. 10-2012-0104371 (with English translation).
Office Action issued Jul. 1, 2014 in Japanese Patent Application No. 2011-216533 (with partial English language translation).
Office Action issued Oct. 24, 2013 in German Patent Application No. 10 2012 216 318.2 (with English language translation).
Office Action issued Sep. 23, 2014 to Chinese Patent Application No. 201210209562.8, with partial English translation.

* cited by examiner

*Primary Examiner* — Thienvu Tran
*Assistant Examiner* — Kevin J Comber
(74) *Attorney, Agent, or Firm* — Oblon, McClelland, Maier & Neustadt, L.L.P.

(57) ABSTRACT

A semiconductor device includes a sense resistor that converts a sense current flowing through a sense terminal of a switching element to a voltage (sense voltage), and an overcurrent protection circuit that performs a protection operation for the switching element when the sense voltage exceeds a threshold. The overcurrent protection circuit can switch the threshold to a first reference voltage, or to a second reference voltage which is lower than the first reference voltage. The overcurrent protection circuit sets the threshold to the second reference voltage at the time of the switching element being in a steady state, and sets the threshold to the first reference voltage during a mirror period immediately after turning-on of the switching element.

3 Claims, 5 Drawing Sheets

F I G. 1
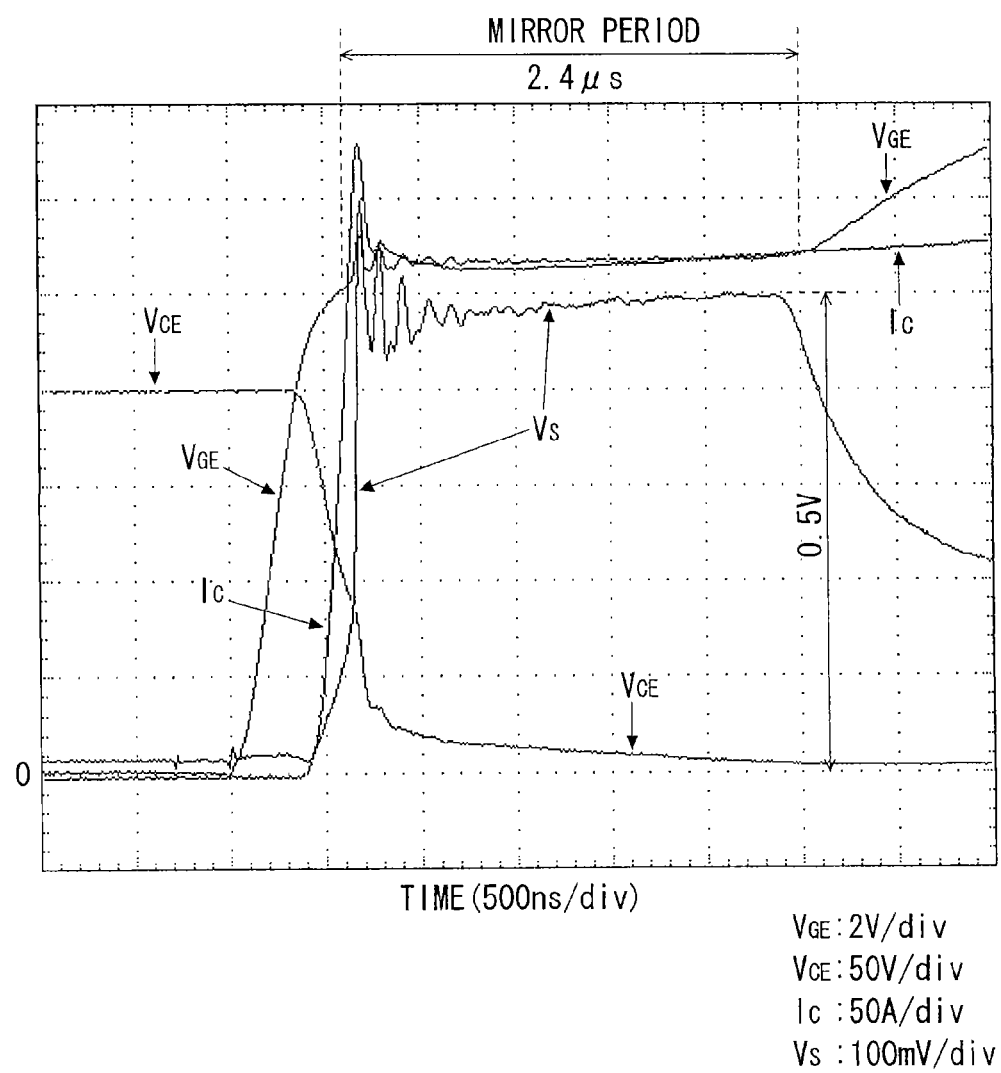

F I G. 2
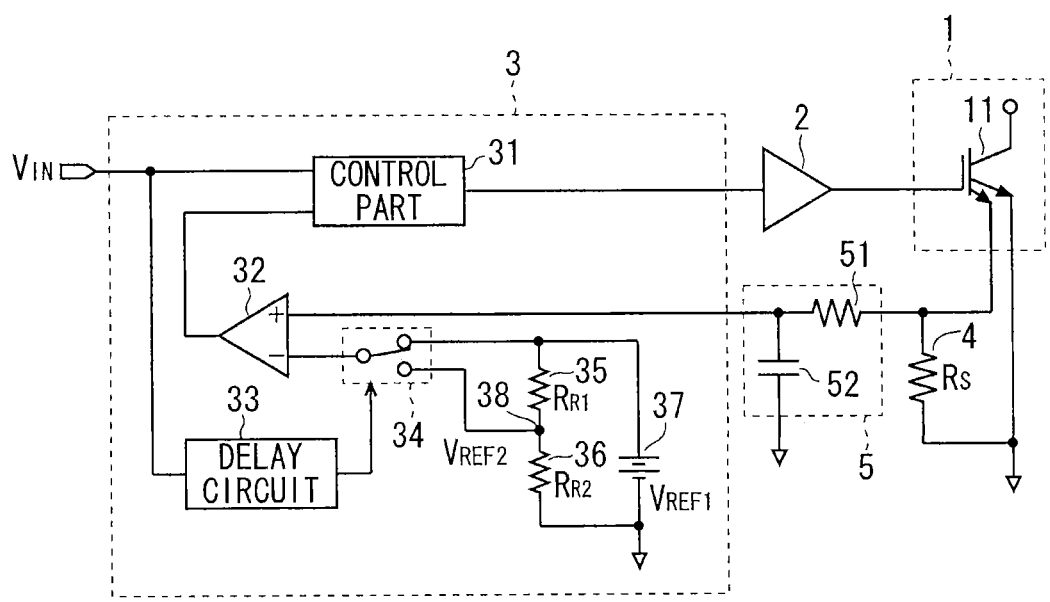

F I G. 3
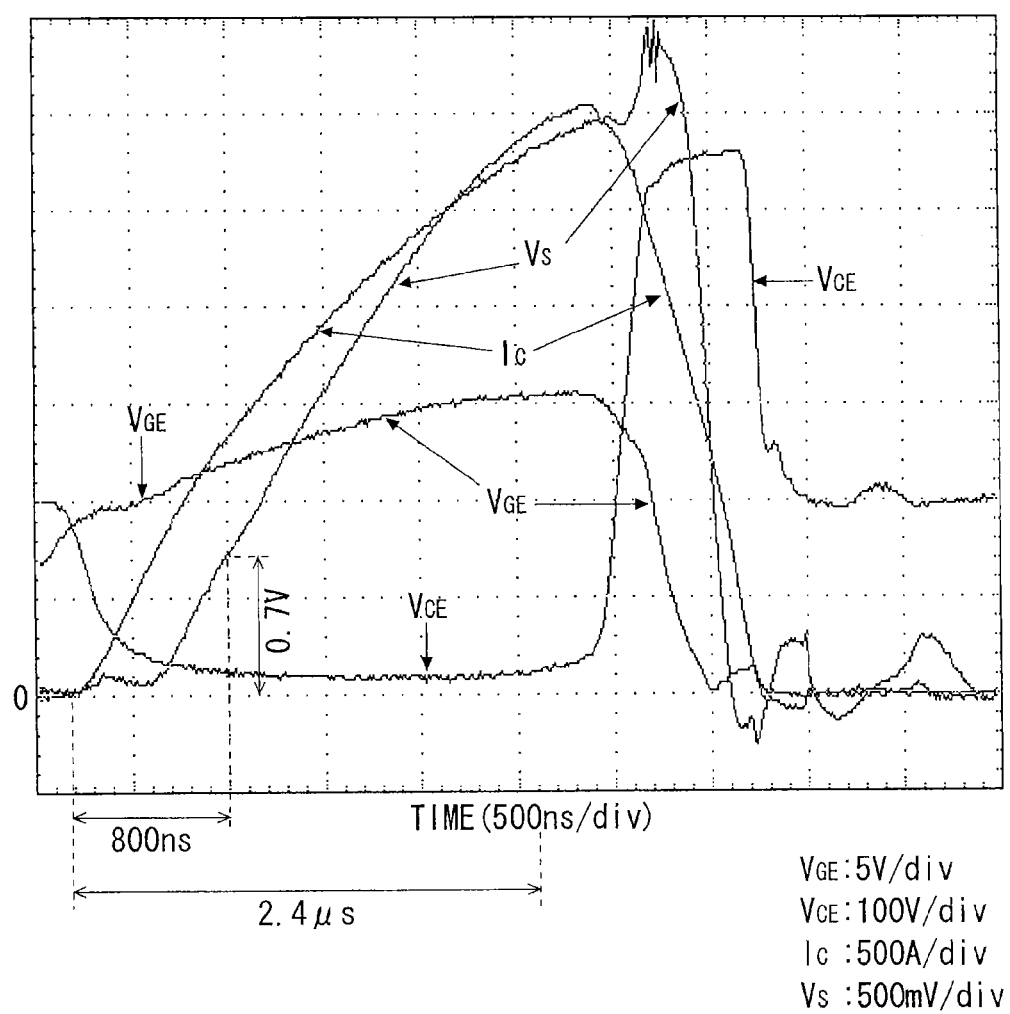

F I G. 4
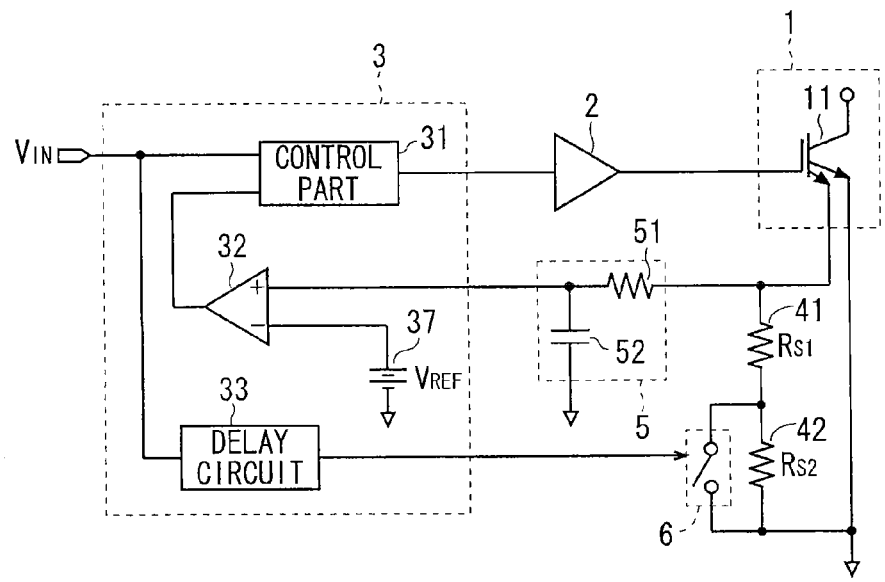
F I G. 5
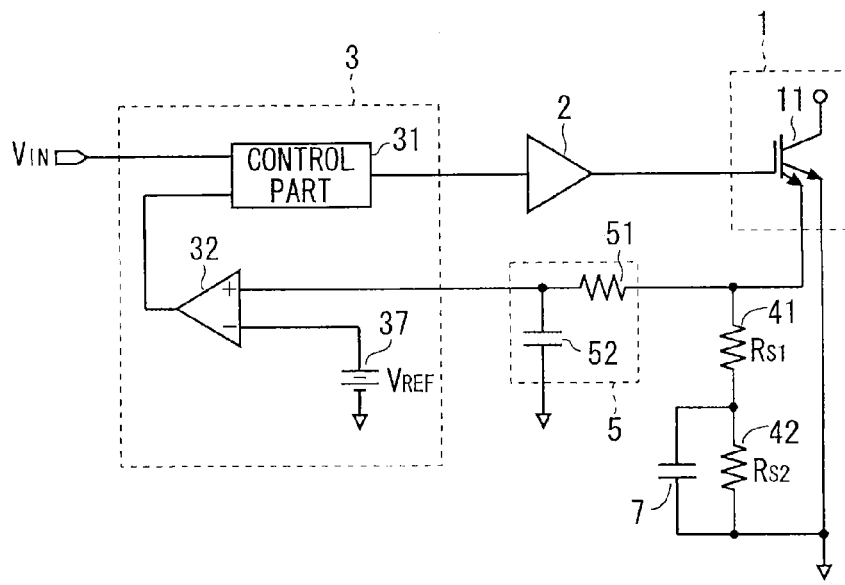

SEMICONDUCTOR DEVICE

BACKGROUND OF THE INVENTION

1. Field of the Invention

The present invention relates to a semiconductor device having an overcurrent protective function of a semiconductor switching element, and particularly relates to prevention of an erroneous operation of an overcurrent protection circuit of the semiconductor switching element, with a mirror period present immediately after turning-on.

2. Description of the Background Art

As a semiconductor device provided with a semiconductor switching element (hereinafter simply referred to as "switching element"), such as an inverter, there is a semiconductor device having an overcurrent protection circuit which performs a protection operation, such as cutting off of the switching element, to protect the switching element when a main current flowing through the switching element exceeds a certain level.

Methods for detecting the main current flowing through the switching element include a direct method for detection by connecting a shunt resistor to a main electrode of the switching element, or the like, and an indirect method for detection by dividing part of the main current into a current detection element (cell) connected in parallel with the switching element and detecting the divided current (sense current). A system using the current detection element (current sense element) has advantages as compared with a system using the shunt resistor, in that power loss due to the shunt resistor does not occur and a system size is reducible.

Generally, in a semiconductor device adopted with the system using the current sense element, dimensions and electric characteristics of the current sense element are set such that a ratio (current division ratio) of the sense current to the main current of the switching element is about $\frac{1}{1000}$ to $\frac{1}{100000}$. The sense current is converted to a voltage (sense voltage) by use of a resistor or the like, and inputted into the overcurrent protection circuit. In the case of the sense voltage exceeding a predetermined threshold, the overcurrent protection circuit determines that an overcurrent has flowed through the switching element, and performs a protection operation such as cutting off of the switching element to prevent damage on the switching element. A value of the main current of the switching element, with which the overcurrent protection circuit starts the protection operation, is referred to as a short circuit protection trip level (hereinafter referred to as "SC trip level".

Unexamined Japanese Patent Application No. 2008-206348 discloses a semiconductor device capable of adjusting a SC trip level in accordance with an element temperature.

Immediately after turning-on of the switching element such as an IGBT or a MOSFET, there is a period referred to as a "mirror period" in which a gate-emitter voltage is held constant in order to charge a gate-collector capacity while the gate current charges a gate-emitter capacity.

Although a current division ratio of the sense current to the main current flowing through the switching element is desirably constant, the current division ratio differs between the switching element being in a mirror-period state and the switching element being in a steady state, and typically, the sense current flowing through the current sense element is larger (i.e., the current division ratio is larger) during the mirror period. Hence the sense voltage to be inputted into the overcurrent protection circuit also increases during the mirror period.

This phenomenon is problematic especially when a free wheel diode (FWD) for keeping a free wheel current (back-flow current) flowing through an inductive load at the time of turning-off of the switching element is connected to the switching element. That is, when the switching element is turned on in a state where the free wheel current is flowing between the inductive load and the free wheel diode, a current with almost the same magnitude as that of the free wheel current flows during the mirror period immediately after the turning-on. Since the sense current flowing through the current sense element is larger during the mirror period than in the steady state, erroneous overcurrent detection occurs due to the sense voltage exceeding a threshold even when the current flowing through the switching element is not higher than the SC trip level, thereby causing the overcurrent protection circuit to perform an erroneous operation.

As a method for preventing this erroneous operation, there have hitherto been used a method for providing the overcurrent protection circuit with a low-pass filter of a time constant that corresponds to the length of the mirror period, a method (Leading Edge Blanking) for masking the sense voltage to be inputted into the overcurrent protection circuit during the mirror period, or the like.

However, with these methods for preventing the erroneous operation, the overcurrent protection circuit does not operate or a delay occurs in start of the operation during the mirror period immediately after turning-on of the switching element. This brings about a problem of delays in overcurrent detection and protection operation in such an abnormal situation as a short circuit in upper and lower arms or a short circuit in an H bridge of a three-phase inverter in a load where an overcurrent flows immediately after turning-on of the switching element.

SUMMARY OF THE INVENTION

It is an object of the present invention to provide a semiconductor device in which an overcurrent protection circuit can balance prevention of an erroneous operation with prevention of a delay in overcurrent detection, immediately after turning-on of the switching element.

A semiconductor device according to the present invention includes a switching element, a passive element that generates a sense voltage obtained by converting to a voltage a sense current divided from a main current flowing through the switching element, and a protection circuit that performs a protection operation for the switching element at the time of the sense voltage exceeding a threshold. The semiconductor device further includes an erroneous operation preventing circuit for preventing the sense voltage from reaching the threshold during a certain period immediately after turning-on of the switching element. The erroneous operation preventing circuit makes a magnitude of the sense voltage small with respect to that of the sense current during the certain period.

According to the present invention, even when a low-pass filter is omitted or a time constant of the low-pass filter is made small without masking an overcurrent detection signal, it is possible to prevent erroneous overcurrent detection immediately after turning-on of the switching element, so as to prevent the erroneous operation of the overcurrent protection circuit. That is, it is possible to reduce a delay in overcurrent detection while preventing the erroneous operation of the overcurrent protection circuit. It is therefore possible to prevent damage on the switching element even in the case of occurrence of such abnormality as flowing of the overcurrent immediately after turning-on of the switching element.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a diagram for explaining a change in sense voltage at the time of turning-on of an IGBT connected with an inductive load;

FIG. 2 is a configuration diagram of a semiconductor device according to a first preferred embodiment;

FIG. 3 is a diagram for explaining a change in sense voltage at the time of a short circuit in upper and lower arms of bridge-connected IGBTs;

FIG. 4 is a configuration diagram of a semiconductor device according to a second preferred embodiment;

FIG. 5 is a configuration diagram of a semiconductor device according to a third preferred embodiment;

DESCRIPTION OF THE PREFERRED EMBODIMENTS

First Preferred Embodiment

Figure 6:
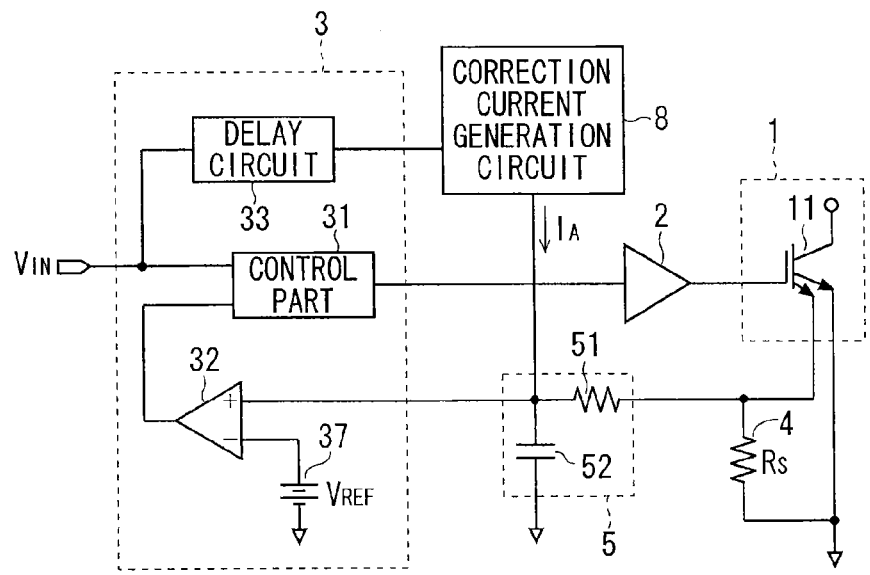
FIG. 6 is a configuration diagram of a semiconductor device according to a fourth preferred embodiment.

First, the problem that occurs during the mirror period of the switching element will be specifically described. FIG. 1 is an example of behaviors of a gate-emitter voltage $V_{GE}$, a collector-emitter voltage $V_{CE}$, a collector current $I_C$ and a sense voltage $V_s$ (one obtained by converting to a voltage a sense current having flowed through a current sense element of an IGBT using a resistance element) at the time of turning-on of the IGBT connected with an inductive load. This example is a state of a case where a collector current $I_C$ of about 260 A flows through an IGBT with a current rating of 300 A immediately after turning-on.

Upon rising of a driving signal to be inputted into a gate of the IGBT, the gate-emitter voltage $V_{GE}$ rises to turn on the IGBT, but immediately thereafter, there is present a period when the gate-emitter voltage $V_{GE}$ is temporarily constant. In FIG. 1, the gate-emitter voltage $V_{GE}$ is held at about 10.8 V during a period of about 2.4 μs immediately after turning-on of the IGBT. This period is a "mirror period". It is observed in FIG. 1 that, despite the collector current $I_C$ being almost constant after ringing immediately after turning-on of the IGBT, the sense voltage $V_s$ becomes the order of 0.5 V after ringing, and decrease after the mirror period.

This rise of the sense voltage $V_s$ induces erroneous detection of the overcurrent immediately after turning-on of the IGBT, to cause the overcurrent protection circuit to perform an erroneous operation. In the example of FIG. 1, when a threshold of the sense voltage $V_s$ at which the overcurrent protection circuit starts a protection operation has been set to not larger than 0.5 V, the overcurrent protection circuit starts the protection operation for the IGBT despite the collector current $I_C$ being not larger than the rating.

FIG. 2 is a configuration diagram of a semiconductor device according to a first preferred embodiment. The semiconductor is provided with a switching element 1, a driving circuit 2, an overcurrent protection circuit 3, a sense resistor 4 and a low-pass filter 5.

In the present preferred embodiment, an IGBT 11 with a current sense element built therein is used as the switching element 1. A sense current proportional to a collector current (main current) of the IGBT 11 flows through an output terminal (sense terminal) of the current sense element.

The sense resistor 4 is connected to between the sense terminal and an emitter terminal of the IGBT 11, and is a passive element that converts a sense current to a voltage (sense voltage). It is to be noted that a resistance value $R_S$ of the sense resistor 4 is equivalent to that of a sense resistor provided in a conventional semiconductor device.

The sense voltage is inputted into the overcurrent protection circuit 3 through a low-pass filter 5 made up of a resistor 51 and a capacitor 52. A time constant of the low-pass filter 5 is not shorter than a ringing cycle, while being sufficiently shorter than the mirror period of the switching element 1, and is desirably not larger than one half of the mirror period. Specifically, for example, it may be made equally long to recovery time for a free wheel diode (not shown) that is used in combination with the switching element 1. A sense voltage with ringing removed therefrom by the low-pass filter 5 is supplied to the overcurrent protection circuit 3, to prevent an erroneous operation due to ringing.

The driving circuit 2 generates a driving signal to be inputted into a gate of the IGBT 11 based on an input signal $V_{IN}$ as a control signal to be inputted from the outside. It is assumed herein that the switching element 1 is controlled so as to be turned on with the input signal $V_{IN}$ being on an H level, and turned off with the input signal $V_{IN}$ being on an L level.

The input signal $V_{IN}$ is supplied to the driving circuit 2 through the overcurrent protection circuit 3. The overcurrent protection circuit 3 monitors a main current flowing through the switching element 1 based on the sense voltage, and normally transmits the input signal $V_{IN}$ to the driving circuit 2. However, when detecting that an overcurrent has flowed through the switching element 1 (the main current has exceeded the SC trip level), the overcurrent protection circuit 3 halts the supply of the input signal $V_{IN}$ to the driving circuit 2, to perform a predetermined protection operation such as cutting off of the switching element 1.

The overcurrent protection circuit 3 is configured by a control part 31, a comparator 32, a delay circuit 33, a switch 34, resistors 35 and 36 and a reference voltage source 37. A series circuit of the resistors 35 and 36 is connected in parallel to the reference voltage source 37, and a second reference voltage $V_{REF2}$, obtained by the resistors 35 and 36 dividing a first reference voltage $V_{REF1}$ outputted by the reference voltage source 37, is outputted to a connection node 38 between the resistors 35 and 36. Hereinafter, the connection node 38 between the resistors 35 and 36 is referred to as a "voltage division reference point".

A sense voltage is inputted into a non-inverting input terminal (positive terminal (+terminal)) of the comparator 32 through the low-pass filter 5. The reference voltage source 37 or the voltage division reference point 38 is selectively connected to an inverting input terminal (negative terminal (−terminal)) of the comparator 32. The second reference voltage $V_{REF2}$ outputted from the voltage division reference point 38 is one obtained by division in a voltage division ratio between the resistors 35 and 36 of the first reference voltage $V_{REF1}$ outputted by the reference voltage source 37, and the second reference voltage $V_{REF2}$ is thus lower than the first reference voltage $V_{REF1}$. The second reference voltage $V_{REF2}$ outputted from the voltage division reference point 38 is set to a value of a sense voltage that appears at the time when the main current corresponding to the SC trip level flows through the switching element 1 (i.e., value equivalent to a threshold, with which an overcurrent protection circuit of the conventional semiconductor device starts the protection operation). The first reference voltage $V_{REF1}$ outputted by the reference voltage source 37 is set to a value of a sense voltage that appears at the time when the main current corresponding to the SC trip level flows through the switching element 1 during the mirror period (i.e., value increased in consideration of a sense current (current division ratio) increased during the mirror period with respect to the threshold, with which the overcurrent protection circuit of the conventional semiconductor device starts the protection operation).

Switching as to whether the negative terminal of the comparator 32 is connected with the reference voltage source 37 or with the voltage division reference point 38 is performed by the switch 34, and its operation is controlled by the delay circuit 33. The delay circuit 33 controls the switch 34, to connect the reference voltage source 37 to the negative terminal of the comparator 32 only during a period from rising of the input signal $V_{IN}$ until lapse of predetermined delay time thereafter, and connect the voltage division reference point 38 to the negative terminal of the comparator 32 during the other periods.

The delay time set in the delay circuit 33 is set equivalent to or not shorter than the length of the mirror period of the switching element 1. The delay time equivalent to the mirror period has been set in the delay circuit 33 in the present preferred embodiment.

An output of the comparator 32 is on an L (Low) level when a sense voltage inputted into the positive terminal is lower than the voltage of the negative terminal (first reference voltage $V_{REF1}$ or the second reference voltage $V_{REF2}$), and the output is on an H (High) level when the sense voltage exceeds a voltage of the negative terminal. The output of the comparator 32 is used for controlling an operation of the control part 31.

The input signal $V_{IN}$ has been inputted to the control part 31. The control part 31 transmits the input signal $V_{IN}$ to the driving circuit 2 when the output of the comparator 32 is on the L level. However, when the output of the comparator 32 shifts to the H level, the control part 31 determines that an overcurrent has flowed through the switching element 1, and outputs to the driving circuit 2 a signal for cutting off the switching element 1, to protect the switching element 1.

In the semiconductor device of FIG. 2, when the sense voltage is lower than a voltage of the negative terminal of the comparator 32, the control part 31 in the overcurrent protection circuit 3 transmits the input signal YIN to the driving circuit 2, and hence the switching element 1 operates in accordance with the input signal $V_{IN}$. Further, when the sense voltage is not lower than the voltage of the negative terminal of the comparator 32, the control part 31 in the overcurrent protection circuit 3 performs the protection operation for the switching element 1.

The voltage of the negative terminal of the comparator 32 serves as the threshold of the sense voltage with which the overcurrent protection circuit 3 starts the protection operation for the switching element 1, but the threshold can be switched by the switch 34. That is, the threshold is the first reference voltage $V_{REF1}$ during a certain period (corresponding to the delay time set in the delay circuit 33) from rise of the input signal $V_{IN}$, and the threshold is the second reference voltage $V_{REF2}$ during the other periods.

In the present preferred embodiment, the second reference voltage $V_{REF2}$ is set lower than the first reference voltage $V_{REF1}$, and the delay time of the delay circuit 33 is set equivalent to the length of the mirror period of the switching element 1. Hence in the semiconductor device of FIG. 2, the threshold of the sense voltage with which the overcurrent protection circuit 3 starts the protection operation for the switching element 1 is set high only during the mirror period immediately after turning-on of the switching element 1.

Consequently, it prevents the sense voltage from reaching the threshold, with which the overcurrent protection circuit 3 starts the protection operation, during the mirror period of the switching element 1. Accordingly, even when the current division ratio of the sense current to the main current in the switching element 1 changes during the mirror period and the sense voltage increases, an erroneous operation of the overcurrent protection circuit 3 due thereto can be prevented.

For example, when the IGBT 11 constituting the switching element 1 takes a behavior shown in FIG. 1 at the time of turning-on, the first reference voltage $V_{REF1}$ is set to 0.7 V, the second reference voltage $V_{REF2}$ to 0.5 V, and the delay time of the delay circuit 33 to not shorter than 2.4 µs. In that case, during the mirror period of the switching element 1, the threshold of the sense voltage with which the overcurrent protection circuit 3 starts the protection operation is 0.7 V, being higher than in the case of the conventional semiconductor device, and hence an erroneous operation of the overcurrent protection circuit 3 is prevented. Furthermore, also during the mirror period, the protection operation can be performed with the threshold corresponding to the first reference voltage $V^{REF1}$.

Further, when the mirror period is completed and the switching element 1 comes into the steady state, its threshold decreases to 0.5 V which is equivalent to in the case of the conventional semiconductor device, thereby allowing a protection operation similar to the conventional protection operation to be performed.

In the semiconductor device of the present preferred embodiment, the time constant of the low-pass filter 5 is set sufficiently shorter than the length of the mirror period, and the method for masking the sense voltage to be inputted into the overcurrent protection circuit 3 during the mirror period is not used, thereby to prevent occurrence of a delay in operation of the overcurrent protection circuit 3. Further, the configuration is formed where only the single reference voltage source 37 is provided and voltage thereof is divided, thereby eliminating the need for a plurality of reference voltage sources, to allow simplification of the circuit.

FIG. 3 shows an example of behaviors of a gate-emitter voltage $V_{GE}$, a collector-emitter voltage $V_{CE}$, a collector current $I_C$ and a sense voltage $V_s$ in the IGBT at the time of bridge-connecting the same IGBT (current rating of 300 A) as one used for the measurement of FIG. 1 and simultaneously turning on the IGBTs on an upper arm and a lower arm to generate a short circuit (short circuit in the upper and lower arms). With an increase in the collector current $I_C$, the sense voltage $V_S$ increases up to 3.5 V at the maximum.

FIG. 3 is an example of the case of using means for masking the sense voltage to be inputted into the overcurrent protection circuit during the mirror period (2.4 µm), and even when a short circuit in the upper and lower arms occurs due to turning-on of the IGBTs and an overcurrent flows, a delay of 2.4 µm occurs until the overcurrent protection circuit starts the protection operation.

As opposed to this, in the semiconductor device of the present preferred embodiment, although the threshold of the sense voltage with which the overcurrent protection circuit 3 starts performing the protection operation is high during the mirror period, an overcurrent detection operation by means of the sense voltage is continuously performed. In the example of FIG. 3, when the configuration of the semiconductor device of the present preferred embodiment has been adopted and the first reference voltage $V_{REF1}$ has been set to 0.7 V, the detection of the overcurrent by the overcurrent protection circuit 3 is 800 ns after turning-on of the IGBT (start of the short circuit in the arms). From this time point, the protection operation is started, and the switching element 1 is protected before a significant increase in the collector current $I_C$. That is, as compared with the means for masking the sense voltage, the time until the protection operation is performed can be reduced by 1.6 µs, and it is thus possible to suppress the overcurrent flowing through the switching element 1, so as to significantly improve protection properties of the switching element 1.

It should be noted that the switching element 1 is not restricted to the IGBT, but may be a switching element having a mirror period, such as a MOSFET. Further, the switching element 1 is not restricted to one formed using silicon (Si), but may, for example, be one formed using a wide band gap semiconductor of silicon nitride (SiC) based material, a gallium nitride (GaN) based material or diamond. The use of the switching element using the wide band gap semiconductor can realize high voltage durability, low loss and high heat durability of the semiconductor device.

Second Preferred Embodiment

FIG. 4 is a configuration diagram of a semiconductor device according to the second preferred embodiment. In FIG. 4, an element having a similar function to that shown in FIG. 2 is provided with the same numeral.

In the present preferred embodiment, the negative terminal of the comparator 32 in the overcurrent protection circuit 3 is connected with the reference voltage source 37 that outputs the reference voltage $V_{REF}$. That is, the threshold, with which the overcurrent protection circuit 3 starts the protection operation, is fixed to the reference voltage $V_{REF}$. A value of a reference voltage $V_{REF}$ is set to a value of a sense voltage that appears at the time when the main current corresponding to the SC trip level flows through the switching element 1 (i.e., value equivalent to a threshold, with which the overcurrent protection circuit of the conventional semiconductor device starts the protection operation).

A series circuit of resistors 41 and 42 is used as the sense resistor to be connected to the sense terminal of the IGBT 11. A sum of a resistance value $R_{S1}$ of the resistor 41 and a resistance value $R_{S2}$ of the resistor 42 is set equivalent to that of the sense resistor provided in the conventional semiconductor device. Further, the resistor 42 is connected in parallel with a switch 6, and the resistor 42 is configured such that each end of the resistor 42 is short-circuited when the switch 6 is turned on.

An operation of the switch 6 is controlled by the delay circuit 33. The delay circuit 33 turns the switch 6 on only during the period from rising of the input signal $V_{IN}$ until lapse of predetermined delay time thereafter, and turns the switch 6 off during the other periods. The delay time set in the delay circuit 33 is set equivalent to or not shorter than the length of the mirror period of the switching element 1. The delay time equivalent to the mirror period has been set in the delay circuit 33 in the present preferred embodiment.

In the semiconductor device of FIG. 4, when the sense voltage to be inputted into the positive terminal of the comparator 32 is lower than the reference voltage $V_{REF}$, the control part 31 in the overcurrent protection circuit 3 transmits the input signal $V_{IN}$ to the driving circuit 2, and the switching element 1 operates in accordance with the input signal $V_{IN}$. Further, when the sense voltage is not lower than the reference voltage $V_{REF}$, the control part 31 in the overcurrent protection circuit 3 performs the protection operation for the switching element 1.

In the semiconductor device of FIG. 4, the resistance value of the sense resistor for generating the sense voltage to be inputted into the positive terminal of the comparator 32 is switched by the switch 6. That is, since the switch 6 is turned on during the certain period (corresponding to the delay time set in the delay circuit 33) from rise of the input signal $V_{IN}$, the sense resistor is only the resistor 41 and its resistance value is $R_{S1}$. On the other hand, during the other periods, the switch 6 is turned on, and hence the sense resistor serves as a series circuit of resistors 41 and 42, and its resistance value is $R_{S1}+R_{S2}$.

In the present preferred embodiment, the delay time of the delay circuit 33 is set equivalent to the length of the mirror period of the switching element 1, and hence in the semiconductor device of FIG. 4, the resistance value of the sense resistor is set smaller than in the case of the conventional semiconductor device only during the mirror period immediately after turning-on of the switching element 1. It is configured that the resistor 42 is short-circuited by the switch 6, and since a resistance value of the sense resistor does not become unstable even during a transient operation of the switch 6 being turned on or off, the overcurrent protection circuit 3 can perform a stable protection operation.

Accordingly, even when the current division ratio of the sense current to the main current in the switching element 1 fluctuates during the mirror period and the sense voltage increases, the increases in sense voltage can be suppressed. That is, it prevents the sense voltage from reaching the threshold, with which the overcurrent protection circuit 3 starts the protection operation, during the mirror period so that the erroneous operation of the overcurrent protection circuit 3 can be prevented.

Further, when the mirror period is completed and the switching element 1 comes into the steady state, the resistance value of the sense resistor becomes equivalent to in the case of the conventional semiconductor device, thereby allowing a protection operation similar to the conventional protection operation to be performed.

Also in the semiconductor device of the present preferred embodiment, the time constant of the low-pass filter 5 is set sufficiently shorter than the length of the mirror period, and the method for masking the sense voltage to be inputted into the overcurrent protection circuit 3 during the mirror period is not used, thereby to prevent occurrence of a delay in operation of the overcurrent protection circuit 3.

In addition, although the switch 6 is connected in parallel to the resistor 42 in FIG. 4, a similar effect can be obtained even when the switch 6 is connected in series to the resistor 41.

Third Preferred Embodiment

FIG. 5 is a configuration diagram of a semiconductor device according to a third preferred embodiment. A configuration of the semiconductor device is one formed by making a capacitor 7 being connected in parallel to the resistor 42 in place of the switch 6 in the configuration of FIG. 4, and omits the delay circuit 33 therefrom.

A time constant of a circuit made up of the resistors 41 and 42 and the capacitor 7 is set equivalent to or not smaller than the mirror period of the switching element 1. In the present preferred embodiment, the time constant is set equivalent to the length of the mirror period.

In the semiconductor device of FIG. 5, similarly to the second preferred embodiment, the capacitor 7 comes into a short-circuited state only during the mirror period immediately after turning-on of the switching element 1, and hence the resistance value of the sense resistor is a smaller value ($R_{s1}$) than in the case of the conventional semiconductor device.

Accordingly, even when the current division ratio of the sense current to the main current in the switching element 1 fluctuates during the mirror period and the sense voltage increases, the increases in sense voltage can be suppressed. That is, it prevents the sense voltage from reaching the threshold, with which the overcurrent protection circuit 3 starts the protection operation, during the mirror period so that the erroneous operation of the overcurrent protection circuit 3 can be prevented. It is possible to perform a protection operation corresponding to the case of the resistance value of the sense resistor being $R_{s1}$ even during the mirror period.

Further, when the mirror period is completed and the switching element 1 comes into the steady state, the resistance value of the sense resistor becomes a value ($R_{s1}+R_{s2}$) equivalent to in the case of the conventional semiconductor device, thereby allowing a protection operation similar to the conventional protection operation to be performed.

Also in the semiconductor device of the present preferred embodiment, the time constant of the low-pass filter 5 is set sufficiently shorter than the length of the mirror period, and the method for masking the sense voltage to be inputted into the overcurrent protection circuit 3 during the mirror period is not used, thereby to prevent occurrence of a delay in operation of the overcurrent protection circuit 3.

Fourth Preferred Embodiment

In the second and third preferred embodiments, the resistance value of the sense resistor is made small during the mirror period of the switching element 1, to make small the sense voltage to be inputted into the overcurrent protection circuit 3 so as to prevent the erroneous operation of the overcurrent protection circuit 3, but a similar effect thereto can also be obtained by using another means to make the sense voltage small during the mirror period.

FIG. 6 is a configuration diagram of a semiconductor device according to a fourth preferred embodiment. The sense resistor of the semiconductor device is one sense resistor 4 as in the first preferred embodiment (FIG. 2). Further, a configuration of the overcurrent protection circuit 3 is similar to in the second preferred embodiment (FIG. 4). Moreover, in the semiconductor device of the present preferred embodiment, a correction current generation circuit 8 that supplies the correction current $I_A$ for biasing the sense current is provided at one end of the sense resistor 4, and a magnitude of a correction current $I_A$ is controlled by the delay circuit 33 in the overcurrent protection circuit 3.

The delay circuit 33 makes small the correction current $I_A$ to be supplied by the correction current generation circuit 8 to the sense resistor 4 only during the period from rising of the input signal $V_{IN}$ until lapse of predetermined delay time thereafter. The delay time set in the delay circuit 33 is set equivalent to or not shorter than the length of the mirror period of the switching element 1.

The delay time equivalent to the mirror period has been set in the delay circuit 33 in the present preferred embodiment. Further, the resistance value $R_S$ of the sense resistor 4 is set such that the sense voltage to be inputted into the positive terminal of the comparator 32 is equivalent to the reference voltage $V_{REF}$ when the main current corresponding to the SC trip level flows through the IGBT 11 in the state of the correction current $I_A$ being large.

In the semiconductor device of FIG. 6, the magnitude of the sense voltage to be inputted into the positive terminal of the comparator 32 changes in accordance with the magnitude of the correction current $I_A$. That is, during the certain period from rising of the input signal $V_{IN}$ (corresponding to the delay time set in the delay circuit 33), the sense voltage is small since the correction current $I_A$ is small. On the other hand, during the other periods, the sense voltage is large since the correction current $I_A$ is large.

In the present preferred embodiment, the delay time of the delay circuit 33 is set equivalent to the length of the mirror period of the switching element 1, and hence in the semiconductor device of FIG. 6, the sense voltage is suppressed only during the mirror period immediately after turning-on of the switching element 1.

Accordingly, even when the current division ratio of the sense current to the main current in the switching element 1 fluctuates during the mirror period and the sense voltage increases, the increases in sense voltage can be suppressed. That is, it prevents the sense voltage from reaching the threshold, with which the overcurrent protection circuit 3 starts the protection operation, during the mirror period so that the erroneous operation of the overcurrent protection circuit 3 can be prevented.

Further, when the mirror period is completed and the switching element 1 comes into the steady state, the sense voltage becomes large, thereby allowing a protection operation similar to the conventional protection operation to be performed.

Also in the semiconductor device of the present preferred embodiment, the time constant of the low-pass filter 5 is set sufficiently shorter than the length of the mirror period, and the method for masking the sense voltage to be inputted into the overcurrent protection circuit 3 during the mirror period is not used, thereby to prevent occurrence of a delay in operation of the overcurrent protection circuit 3.

It is to be noted that, although a flowing direction of the correction current $I_A$ is a direction from the correction current generation circuit 8 toward the sense resistor 4 (direction of an arrow in FIG. 6) in the above description, it may be a reverse direction thereto. When the correction current $I_A$ flows from the sense resistor 4 to the correction current generation circuit 8, the correction current $I_A$ may be made large only during the mirror period of the switching element 1. Further, the correction current $I_A$ may be allowed to flow from the sense resistor 4 to the correction current generation circuit 8 during the mirror period of the switching element 1, and the correction current $I_A$ may be allowed to flow from the correction current generation circuit 8 to the sense resistor 4 during the other periods.

Fifth Preferred Embodiment

Figure 7:
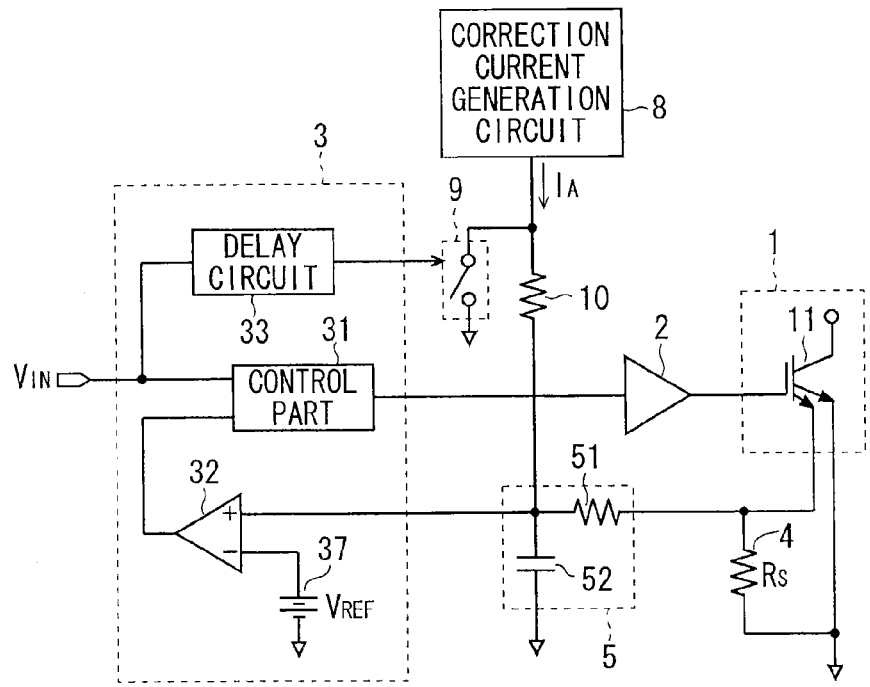
FIG. 7 is a configuration diagram of a semiconductor device according to a fifth preferred embodiment.

FIG. 7 is a configuration diagram of a semiconductor device according to a fifth preferred embodiment. The semiconductor device is configured with respect to the configuration of FIG. 6 such that the correction current $I_A$ outputted by the correction current generation circuit 8 is made to have a fixed value, and the correction current $I_A$ to be supplied from the correction current generation circuit 8 to the sense resistor 4 can be bypassed by a switch 9.

During the period from rising of the input signal $V_{IN}$ until lapse of predetermined delay time thereafter, the delay circuit 33 turns the switch 9 on to bypass the correction current $I_A$ to the ground so as to halt the supply of the correction current $I_A$ to the sense resistor 4. The delay time set in the delay circuit 33 is set equivalent to or not shorter than the length of the mirror period of the switching element 1.

The delay time equivalent to the mirror period has been set in the delay circuit 33 in the present preferred embodiment. Further, the resistance value $R_S$ of the sense resistor 4 is set such that the sense voltage to be inputted into the positive terminal of the comparator 32 is equivalent to the reference voltage $V_{REF}$ when the main current corresponding to the SC trip level flows through the IGBT 11, with the correction current $I_A$ being in a state of being supplied to the resistor 4 (the switch 9 being in an off-state).

In FIG. 7, a resistor 10 connected to between the switch 9 and the sense resistor 4 as well as the comparator 32 is one to prevent the sense current being bypassed to the ground through the switch 9 when the switch 9 is turned on. In addition, the resistor 10 may be configured that the correction current $I_A$ outputted by the correction current generation circuit 8 increases or decreases in accordance with an element temperature.

In the semiconductor device of FIG. 7, the magnitude of the sense voltage to be inputted into the positive terminal of the comparator 32 changes in accordance with on/off of the switch 9. That is, during the certain period from rising of the input signal $V_{IN}$ (corresponding to the delay time set in the delay circuit 33), the sense voltage is small since the switch 9 is turned on and the correction current $I_A$ is thus not supplied to the sense resistor 4. On the other hand, during the other periods, the sense voltage is large since the correction current $I_A$ is supplied to the sense resistor 4.

In the present preferred embodiment, the delay time of the delay circuit 33 is set equivalent to the length of the mirror period of the switching element 1, and hence in the semiconductor device of FIG. 7, the sense voltage is suppressed only during the mirror period immediately after turning-on of the switching element 1.

Accordingly, even when the current division ratio of the sense current to the main current in the switching element 1 fluctuates during the mirror period and the sense voltage increases, the increases in sense voltage can be suppressed. That is, it prevents the sense voltage from reaching the threshold, with which the overcurrent protection circuit 3 starts the protection operation, during the mirror period so that the erroneous operation of the overcurrent protection circuit 3 can be prevented.

Further, when the mirror period is completed and the switching element 1 comes into the steady state, the sense voltage becomes large, thereby allowing a protection operation similar to the conventional protection operation to be performed.

Also in the semiconductor device of the present preferred embodiment, the time constant of the low-pass filter 5 is set sufficiently shorter than the length of the mirror period, and the method for masking the sense voltage to be inputted into the overcurrent protection circuit 3 during the mirror period is not used, thereby to prevent occurrence of a delay in operation of the overcurrent protection circuit 3.

It is to be noted that in the present invention, each preferred embodiment can be combined without restriction and can be modified and omitted as appropriate within the claims of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
a switching element;
a passive element that generates a sense voltage obtained by converting to a voltage a sense current divided from a main current flowing through said switching element;
a protection circuit that performs a protection operation for said switching element at the time of said sense voltage exceeding a threshold; and
an erroneous operation preventing circuit for preventing said sense voltage from reaching said threshold during a certain period immediately after turning-on of said switching element, wherein
said erroneous operation preventing circuit makes a magnitude of said sense voltage small with respect to that of said sense current during said certain period,
said erroneous operation preventing circuit makes small a resistance value of said passive element during said certain period,
said passive element includes first and second resistors connected in series and a capacitor connected in parallel to one of said first resistor and second resistor, one of said first and second resistors being connected directly to a sense output terminal of the switching element, and
a time constant of said passive element corresponds to a length of said certain period.

2. A semiconductor device, comprising:
a switching element;
a passive element that generates a sense voltage obtained by converting to a voltage a sense current divided from a main current flowing through said switching element;
a protection circuit that performs a protection operation for said switching element at the time of said sense voltage exceeding a threshold; and
an erroneous operation preventing circuit for preventing said sense voltage from reaching said threshold during a certain period immediately after turning-on of said switching element, wherein
said erroneous operation preventing circuit makes a magnitude of said sense voltage small with respect to that of said sense current during said certain period, and
said sense voltage is inputted into said protection circuit through a low-pass filter having a time constant not larger than one half of a mirror period of said switching element.

3. A semiconductor device, comprising:
a switching element;
a passive element that generates a sense voltage obtained by converting to a voltage a sense current divided from a main current flowing through said switching element;
a protection circuit that performs a protection operation for said switching element at the time of said sense voltage exceeding a threshold;
a reference voltage source;
a voltage dividing circuit that divides a voltage generated by said reference voltage source; and
an erroneous operation preventing circuit for making said threshold of said protection circuit high, thereby to prevent said sense voltage from reaching said threshold during a certain period immediately after turning-on of said switching element,
wherein said erroneous operation preventing circuit takes a voltage, generated by said reference voltage source, as said threshold during said certain period; and takes a voltage, generated by said voltage dividing circuit, as said threshold during periods other than said certain period, and said sense voltage is inputted into said protection circuit through a low-pass filter having a time constant not larger than one half of a mirror period of said switching element.

* * * * *